United States Patent
Richter et al.

(10) Patent No.: US 8,384,161 B2
(45) Date of Patent: Feb. 26, 2013

(54) CONTACT OPTIMIZATION FOR ENHANCING STRESS TRANSFER IN CLOSELY SPACED TRANSISTORS

(75) Inventors: Ralf Richter, Dresden (DE); Kai Frohberg, Niederau (DE); Holger Schuehrer, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 286 days.

(21) Appl. No.: 12/823,438

(22) Filed: Jun. 25, 2010

(65) Prior Publication Data

US 2010/0327367 A1  Dec. 30, 2010

(30) Foreign Application Priority Data

Jun. 30, 2009 (DE) .......................... 10 2009 031 111

(51) Int. Cl.
*H01L 27/092* (2006.01)
(52) U.S. Cl. ............................... 257/369; 257/E27.062
(58) Field of Classification Search .................. 257/369, 257/E27.062
See application file for complete search history.

(56) References Cited

U.S. PATENT DOCUMENTS

| | | | |
|---|---|---|---|
| 8,120,119 B2 * | 2/2012 | Fischer et al. | 257/383 |
| 2006/0131662 A1 * | 6/2006 | Yamada et al. | 257/374 |
| 2007/0132032 A1 | 6/2007 | Teo et al. | 257/369 |
| 2008/0157224 A1 | 7/2008 | Fischer et al. | 257/401 |
| 2008/0265330 A1 * | 10/2008 | Gerhardt et al. | 257/369 |
| 2009/0321837 A1 | 12/2009 | Wei et al. | 257/368 |
| 2011/0215415 A1 * | 9/2011 | Gerhardt et al. | 257/369 |
| 2012/0091535 A1 * | 4/2012 | Frohberg et al. | 257/369 |

FOREIGN PATENT DOCUMENTS

| | | |
|---|---|---|
| DE | 102007020258 A1 | 11/2008 |
| DE | 102008030852 A1 | 1/2010 |

OTHER PUBLICATIONS

Translation of Official Communication from German Patent Office for German Patent Application No. 10 2009 031 111.4-33 dated Apr. 6, 2010.

* cited by examiner

*Primary Examiner* — Victor A Mandala
(74) *Attorney, Agent, or Firm* — Williams, Morgan & Amerson, P.C.

(57) ABSTRACT

By appropriately designing the geometric configuration of a contact level of a sophisticated semiconductor device, the tensile stress level of contact elements in N-channel transistors may be increased, while the tensile strain component of contact elements caused in the P-channel transistor may be reduced.

26 Claims, 4 Drawing Sheets

CONTACT OPTIMIZATION FOR ENHANCING STRESS TRANSFER IN CLOSELY SPACED TRANSISTORS

BACKGROUND OF THE INVENTION

1. Field of the Invention

Generally, the present disclosure relates to the field of integrated circuits, and, more particularly, to field effect transistors and manufacturing techniques on the basis of strain-inducing mechanisms.

2. Description of the Related Art

Integrated circuits typically include a large number of circuit elements located on a given chip area according to a specified circuit layout, wherein, in complex circuits, the field effect transistor represents one predominant circuit element. Generally, a plurality of process technologies for advanced semiconductor devices are currently practiced, wherein, for complex circuitry based on field effect transistors, such as microprocessors, storage chips and the like, CMOS technology is currently one of the most promising approaches due to the superior characteristics in view of operating speed and/or power consumption and/or cost efficiency. During the fabrication of complex integrated circuits using CMOS technology, millions of complementary transistors, i.e., N-channel transistors and P-channel transistors, are formed on a substrate including a crystalline semiconductor layer. A field effect transistor, irrespective of whether an N-channel transistor or a P-channel transistor is considered, comprises so-called PN junctions that are formed by an interface of highly doped drain and source regions with an inversely or weakly doped channel region disposed between the drain region and the source region. The conductivity of the channel region, i.e., the drive current capability of the conductive channel, is controlled by a gate electrode formed above the channel region and separated therefrom by a thin insulating layer. The conductivity of the channel region, upon formation of a conductive channel due to the application of an appropriate control voltage to the gate electrode, depends on the dopant concentration, the mobility of the charge carriers and, for a given extension of the channel region in the transistor width direction, on the distance between the source and drain regions, which is also referred to as channel length. Hence, in combination with the capability of rapidly creating a conductive channel below the insulating layer upon application of the control voltage to the gate electrode, the conductivity of the channel region substantially determines the performance of MOS transistors. Thus, the reduction of the channel length, and associated therewith the reduction of the channel resistivity, may be a dominant design criterion for accomplishing an increase in the operating speed of the integrated circuits.

The shrinkage of the transistor dimensions, however, involves a plurality of issues associated therewith that have to be addressed so as to not unduly offset the advantages obtained by steadily decreasing the channel length of MOS transistors. One issue associated with reduced gate lengths is the occurrence of so-called short channel effects, which may result in a reduced controllability of the channel conductivity. Short channel effects may be countered by certain design techniques, some of which, however, may be accompanied by a reduction of the channel conductivity, thereby partially offsetting the advantages obtained by the reduction of critical dimensions.

In view of this situation, it has been proposed to enhance device performance of the transistor elements not only by reducing the transistor dimensions but also by increasing the charge carrier mobility in the channel region for a given channel length, thereby increasing the drive current capability and thus transistor performance. For example, the lattice structure in the channel region may be modified, for instance by creating tensile or compressive strain therein, which results in a modified mobility for electrons and holes, respectively. For example, creating tensile strain in the channel region of a silicon layer having a standard crystallographic configuration may increase the mobility of electrons, which in turn may directly translate into a corresponding increase of the conductivity of N-type transistors. On the other hand, compressive strain in the channel region may increase the mobility of holes, thereby providing the potential for enhancing the performance of P-type transistors.

One efficient approach in this respect is a technique that enables the creation of desired stress conditions within the channel region of different transistor elements by adjusting the stress characteristics of a dielectric layer stack that is formed above the basic transistor structure. The dielectric layer stack typically comprises one or more dielectric layers which may be located close to the transistor and which may also be used in controlling a respective etch process in order to form contact openings to the gate and drain and source terminals. Therefore, an effective control of mechanical stress in the channel regions, i.e., effective stress engineering, may be accomplished by individually adjusting the internal stress of these layers, which may also be referred to as contact etch stop layers, and by positioning a contact etch contact layer having an internal compressive stress above a P-channel transistor while positioning a contact etch stop layer having an internal tensile strain above an N-channel transistor, thereby creating compressive and tensile strain, respectively, in the respective channel regions.

Typically, the contact etch stop layer is formed by plasma enhanced chemical vapor deposition (PECVD) processes above the transistor, i.e., above the gate structure and the drain and source regions, wherein, for instance, silicon nitride may be used due to its high etch selectivity with respect to silicon dioxide, which is a well-established interlayer dielectric material. Furthermore, PECVD silicon nitride may be deposited with a high intrinsic stress, for example, up to 3 Giga Pascal (GPa) or higher of compressive stress and up to 2 GPa and higher of tensile stress, wherein the type and the magnitude of the intrinsic stress may be efficiently adjusted by selecting appropriate deposition parameters. For example, ion bombardment, deposition pressure, substrate temperature, gas flow rates and the like represent respective parameters that may be used for obtaining the desired intrinsic stress.

When forming two types of stressed layers, however, these strain-inducing mechanisms may suffer from a reduced efficiency when device dimensions are increasingly scaled down, for instance in the 45 nm technology and further advanced approaches, due to the limited conformal deposition capabilities of the deposition processes involved. That is, for a given maximum internal stress level that may be achieved in the dielectric materials, typically the amount of the stressed dielectric material that may be positioned close to the channel region of the transistors may be restricted by the deposition capabilities of the associated deposition techniques. Furthermore, upon further scaling the overall transistor dimensions, in particular in device regions including a large number of transistors that are closely packed, the overall performance of the transistor elements may increasingly be influenced by the contact elements connecting to the drain and source regions of the closely packed transistors. In this case, it has been observed that drive current capability and thus transistor performance may strongly depend on the characteristics and the configuration of a contact structure, as will be described with reference to FIGS. 1a and 1b in more detail.

FIG. 1a schematically illustrates a top view of a sophisticated semiconductor device 100 comprising a plurality of closely packed transistor elements of which an N-channel transistor 150A and a P-channel transistor 150B are illustrated for convenience. For example, the transistors 150A, 150B may represent any transistors in closely packed device regions, such as static RAM (random access memory) areas and the like. An active region 102A may be defined by an isolation structure 103, for instance in the form of a shallow trench isolation and may comprise drain and source regions (not shown) of the transistor 150A and possibly of other transistors that may be formed on the basis of the active region 102A. Similarly, the transistor 150B comprises an active region 102B defined by the isolation structure 103. Moreover, a gate electrode structure 151 may be formed above the active regions 102A and 102B, respectively, and may extend above the isolation structure 103. The gate electrode structures 151 may be of any appropriate configuration and may have critical dimensions in accordance with the overall design rules. Thus, the transistors 150A, 150B may have a transistor width direction, indicated as W, and a length direction, indicated as L, wherein, in the example shown, the width of the transistors 150A, 150B may be 100 nm and less, while a length of the electrodes of the gate electrode structures 151 may be 40 nm and less. Furthermore, the transistors 150A, 150B may be embedded into an interlayer dielectric material, which for convenience is not illustrated in FIG. 1a. Additionally, contact elements 161A, 161B are provided so as to connect to the active regions 102A, 102B, respectively, at the drain side and source side of the transistors 150A, 150B. In the example shown, a single contact element 161A may be provided to connect to the drain of the transistor 150A and a single contact element 161A to connect to the source of the transistor 150A due to the reduced width of the transistor 150A. Likewise, a single contact element 161B connects to the drain region and a single contact element 161B connects to the source region of the transistor 150B. Consequently, the presence of the contact elements 161A, 161B in close proximity to the drain and source regions may have an influence on the overall strain conditions in the channel region of the transistors 150A, 150B, in particular if a highly stressed dielectric material of the interlayer dielectric material may have to be provided with a reduced thickness and thus with a reduced amount due to deposition related restrictions, as explained above. Furthermore, the contact elements 161A, 161B may themselves be formed on the basis of, for instance, tungsten which may be deposited so as to exhibit a tensile internal stress component, which may thus also have influence on the overall strain conditions in the channel regions of the transistors 150A, 150B.

FIG. 1b schematically illustrates a cross-sectional view of the device of FIG. 1a according to the line Ib. As illustrated, the device 100 comprises a substrate 101, such as a silicon substrate or any other appropriate carrier material, above which is formed a silicon-based semiconductor layer 102. The semiconductor layer 102 comprises the active regions 102A, 102B and portions of the isolation structure 103 (not shown) so as to appropriately define the size and shape of the active regions 102A, 102B. Moreover, drain and source regions 152 are formed in the active regions 102A, 102B in accordance with the overall transistor characteristics. That is, highly N-doped drain and source regions are provided in the transistor 150A and highly P-doped drain and source regions 152 are provided in the transistor 150B. Furthermore, in order to reduce the contact resistivity and the overall series resistance in the transistors 150A, 150B, a metal silicide material 154, such as a nickel silicide, a nickel/platinum silicide and the like, is typically formed in the drain and source regions and acts as a contact area for connecting to the contact elements 161A, 161B, respectively. Furthermore, as shown, the gate electrode structures 151 may have any appropriate configuration and may comprise a gate electrode 151A that is separated from a channel region 153 by a gate dielectric material 151B. Furthermore, if required, a spacer structure 151C may be included in the gate electrode structures 151. Additionally, a contact level 160, which may be understood as the combination of any appropriate interlayer dielectric material and the corresponding contact elements 161A, 161B, is formed to encapsulate and thus passivate the transistors 150A, 150B while at the same time providing electrical contact via the contact elements 161A, 161B such that the contact level 160 acts as an "interface" between the circuit elements formed in and above the semiconductor layer 102, such as the transistors 150A, 150B, and a metallization system (not shown) formed or to be formed on the contact level 160 and comprising a network of metal lines and vias for establishing the required electrical connections. As discussed above, the contact level 160 comprises a strain-inducing material 162A formed above the transistor 150A in order to induce a desired strain component therein. Similarly, a strain-inducing material 162B is formed above the transistor 150B and provides a desired strain component. Additionally, a further dielectric material 163 is typically provided in accordance with the overall device requirements.

The semiconductor device 100 as shown in FIGS. 1a and 1b may be formed on the basis of the following processes. After forming the isolation structure 103, the basic configuration of the active regions 102A, 102B may be established by well-known implantation processes in combination with appropriate masking regimes. Thereafter, the gate electrode structures 151 are formed by providing one or more appropriate materials for the gate dielectric material 151B, which may include high-k dielectric materials, i.e., dielectric materials having a dielectric constant of 10.0 or higher, possibly in combination with "conventional" dielectric materials, such as silicon oxide based materials and the like. Similarly, the gate electrode material 151A may be formed, for instance, by using a placeholder material, if sophisticated metal-containing electrode materials are to be provided in a later manufacturing stage. In other cases, the electrode material 151A may comprise a work function adjusting species, in combination with polysilicon, silicon, silicon/germanium and the like, depending on the overall process strategy. It should further be appreciated that additional materials, such as dielectric cap materials, hard mask materials and the like, may also be deposited in combination with the electrode material 151A, depending on the overall process strategy. Thereafter, sophisticated lithography and etch techniques may be applied in order to obtain the gate electrode 151A with a desired critical dimension in accordance with the design rules. Thereafter, the drain and source regions 152 may be formed on the basis of ion implantation, epitaxial growth techniques, a combination thereof and the like, as is required for achieving the desired transistor characteristics. For example, frequently, a strain-inducing semiconductor alloy may be provided in one or both of the transistors 150A, 150B so as to obtain a desired high strain component in the channel region 153. For this purpose, an appropriate semiconductor alloy, such as silicon/germanium or silicon/carbon, may be incorporated into the active regions 102A or 102B, or both, possibly in an in situ doped state. Furthermore, the spacer structure 151C may be formed so as to provide a desired offset, for instance, with respect to introducing dopant species, forming the metal silicide regions 154 and the like. After completing the drain and source regions 152, the metal silicide regions 154 may be formed on the basis of well-established process techniques, wherein a portion of the gate electrode material 151A may also be converted into a metal silicide, if required, while in other cases the silicidation thereof may be suppressed by providing a corresponding cap material. Next, the layers 162A, 162B may be formed, possibly in combination with appropriate etch stop materials and the like, which for convenience are not shown. To this end, appropriate deposition techniques for forming silicon nitride material, nitrogencontaining silicon carbide material and the like may be applied in order to obtain the desired internal stress level of the layers 162A, 162B. As previously discussed, due to the reduced overall transistor dimensions and also due to the increasing packing density, the thickness of the layers 162A, 162B may be restricted by the overall device geometry so that, for a given maximum internal stress level achievable by presently available deposition techniques, the final strain level in the channel regions 153 may be less than desired. Thereafter, the material 163 may be deposited and planarized in order to prepare a substantially planar surface topography for the subsequent complex patterning process for forming the contact elements 161A, 161B. During the corresponding patterning process, an etch mask may be formed on the basis of sophisticated lithography techniques in order to define the lateral size and shape as well as position of the contact elements 161A, 161B, as is, for instance, shown in FIG. 1a. During the patterning process, the layer 163 may be etched first and subsequently an appropriate etch chemistry may be selected so as to etch through the layers 162A, 162B in order to finally expose a portion of the metal silicide regions 154. Thereafter, the corresponding openings may be filled with an appropriate contact metal, wherein frequently tungsten may be used in combination with an appropriate barrier material, such as titanium, titanium nitride and the like. The deposition of the tungsten material may typically be accomplished on the basis of a chemical vapor deposition (CVD) process, during which the material may deposit with a tensile stress component which may thus act on the transistors 150A, 150B and may therefore influence the final strain conditions in the channel regions 153. Thus, as previously explained, with the continuous shrinkage of the transistor dimensions, the effect of the layers 162A, 162B on the finally obtained strain conditions in the channel regions 153 may become increasingly less pronounced, while the contact elements 161A, 161B may increasingly influence the strain conditions and thus the overall performance of the transistors 150A, 150B. In this case, the tensile internal stress of the contact elements 161A may have a positive effect on the N-channel transistor 150A, while on the other hand, the P-channel transistor 150B may be negatively affected by the tensile stress of the contact elements 161B by, for instance, reducing any compressive strain component which may be induced by the layer 162B, or by any other compressive strain-inducing mechanism.

The present disclosure is directed to various devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure relates to semiconductor devices in which performance of sophisticated transistor devices may be adjusted by appropriately designing the contact level of the devices in view of taking into consideration the effect of stressed contact elements. To this end, the lateral size of contact elements and/or the spatial relationship of the contact elements with respect to the gate electrode structures may be appropriately adjusted in order to increase a desired influence of contact elements on one type of transistor, while reducing a negative effect on the other type of transistor. Consequently, in some illustrative aspects disclosed herein, an appropriate adjustment of the finally obtained transistor performance may be accomplished by an appropriate configuration in the contact level only, thereby avoiding any significant modifications of the basic transistor configuration and the associated process techniques. In other illustrative embodiments, the appropriate configuration of the contact level may be accompanied by additional adaptations in a "third dimension" with respect to the lateral configuration of the contact structure, which may be accomplished, for instance, by providing a recessed drain and source configuration for one type of transistor, thereby also increasing the influence of the contact elements.

One illustrative semiconductor device disclosed herein comprises a first transistor formed above a substrate and comprising a first gate electrode structure extending along a first transistor width direction of the first transistor. The semiconductor device further comprises a second transistor formed above the substrate and comprising a second gate electrode structure that extends along a second transistor width direction of the second transistor. Additionally, the semiconductor device comprises a first contact element connecting to one of a drain region and a source region of the first transistor, wherein the first contact element comprises a contact metal having a predefined type of internal stress in order to induce a first strain component of a first type in a channel region of the first transistor. Moreover, the semiconductor device comprises a second contact element connecting to one of a drain region and a source region of the second transistor and comprising the contact metal having the predefined type of internal stress. The first and second contact elements differ in at least one of a lateral size and a lateral spatial relationship with respect to a respective one of the first gate electrode structure and the second gate electrode structure such that a second strain component of the first type is induced in a channel region of the second transistor, wherein the second strain component is less than the first strain component.

A further illustrative semiconductor device disclosed herein comprises an N-channel transistor comprising a first contact region and a P-channel transistor comprising a second contact region. The semiconductor device further comprises a tensile strained first contact element that connects to the first contact region and has a first lateral extension along a width direction of the N-channel transistor. Additionally, the semiconductor device comprises a second tensile strained contact element that connects to the second contact region and has a second lateral extension along a width direction of the P-channel transistor, wherein the second lateral extension is less than the first lateral extension.

A still further illustrative semiconductor device disclosed herein comprises an N-channel transistor comprising a first gate electrode and a first contact region. The semiconductor device further comprises a P-channel transistor comprising a second gate electrode and a second contact region. Moreover, a tensile strained first contact element is provided and connects to the first contact region and has a first lateral extension representing a maximum lateral extension along a width direction of the N-channel transistor. Furthermore, the semiconductor device comprises a second tensile strained contact element connecting to the second contact region and having a second lateral extension representing a maximum lateral extension along a width direction of the P-channel transistor, wherein a first offset of the first lateral extension from the first gate electrode is less than a second offset of the second lateral extension from the second gate electrode structure.

BRIEF DESCRIPTION OF THE DRAWINGS

The disclosure may be understood by reference to the following description taken in conjunction with the accompanying drawings, in which like reference numerals identify like elements, and in which:

FIG. 1b schematically illustrates a cross-sectional view of the semiconductor device of FIG. 1a;

Figure 1A:
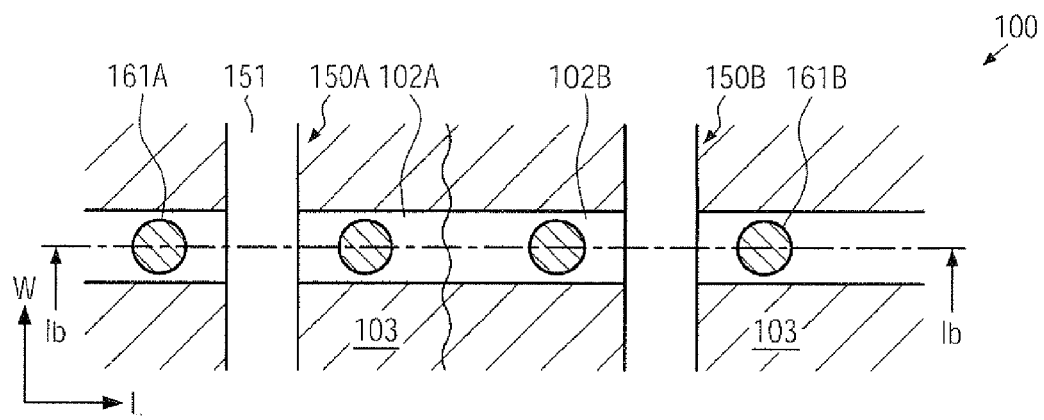
FIG. 1a schematically illustrates a top view of a semiconductor device including highly scaled transistors and contact elements connecting thereto, according to a conventional design.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the present disclosure provides semiconductor devices and corresponding manufacturing techniques and layout concepts in which the design of a contact level may be adapted such that the internal stress level of contact elements may be advantageously used for enhancing transistor performance of one type of transistor while at the same time reducing the influence of the contact elements for the other type of transistor. According to illustrative embodiments disclosed herein, an appropriate configuration may be obtained by adjusting a lateral size of contact elements differently for N-channel transistors and P-channel transistors in order to achieve a superior strain condition in the channel regions of one type of transistor while reducing a negative effect in the other type of transistor. In this context, a lateral size of a contact element is to be understood as the cross-sectional area of a contact element taken at any appropriate height level above a semiconductor layer, in and above which transistor elements are formed. Thus, the lateral size of the contact element is to be understood as being defined by lateral extensions of the contact elements along two linearly independent lateral directions, such as a length direction and a width direction of a transistor, wherein the corresponding extensions may be taken at any given height level. On the other hand, if a one-dimensional lateral measure of a contact element is referred to in this context, it is to be understood that an extension of the contact element is meant along a well-defined direction, such as a width direction or a length direction of a transistor within a given height level. That is, if lateral sizes or lateral extensions are referred to it should be understood that these values are obtained on the basis of the above-specified definition within approximately the same height level for different contact elements so as to enable a comparison between these values.

In other illustrative embodiments disclosed herein, a desired strain engineering on the basis of internally stressed contact elements may be accomplished by appropriately selecting a spatial relationship of the contact elements such that a desired strain enhancement may be obtained for one type of transistor while an unwanted strain component may be reduced for the other type of transistor. In this context, a lateral spatial relationship is to be understood as at least one of a lateral position, a lateral size, a lateral shape, an orientation of a lateral shape and an offset from or with respect to a neighboring gate electrode structure of the transistor under consideration in order to control the effect of strain modification caused by the contact element. Hence, a difference in lateral spatial relationship of contact elements in two different transistors is to be understood that the lateral spatial relationships may differ in at least one of the above-identified geometrical items. For example, the spatial relationships of contact elements may even differ if these contact elements may have the same lateral offset, lateral shape and lateral size with respect to the associated gate electrode structures, when an orientation of the lateral shapes is different for the contact elements. Even in this case, a significantly different strain-inducing effect may be induced in the channel region of the respective transistor, however, without significantly affecting other transistor characteristics, such as overall conductivity of the contact elements and the like.

In other illustrative embodiments, the difference in lateral size and the difference in the lateral spatial relationship may be applied commonly, for example, by providing contact elements of different lateral size and of different offset from the corresponding gate electrodes in order to even further enhance the overall strain engineering, without requiring very pronounced differences in individual design quantities, such as the critical dimension of the contact elements with respect to the size thereof and the critical dimension with respect to an offset of the gate electrode structure and the like. Thus, similar process conditions may be achieved during the formation of the contact elements while nevertheless providing an efficient adaptation of the strain conditions in the transistors of different conductivity type.

In still other illustrative embodiments disclosed herein, the adaptation of the configuration of the contact elements within the contact level may be combined with a further adaptation in a "non-lateral" direction, such as the depth direction, for instance by providing a recessed drain and source configuration for one type of transistor in order to further enhance the efficiency of the strain-inducing mechanism provided by the stressed contact elements.

Figure 1B:
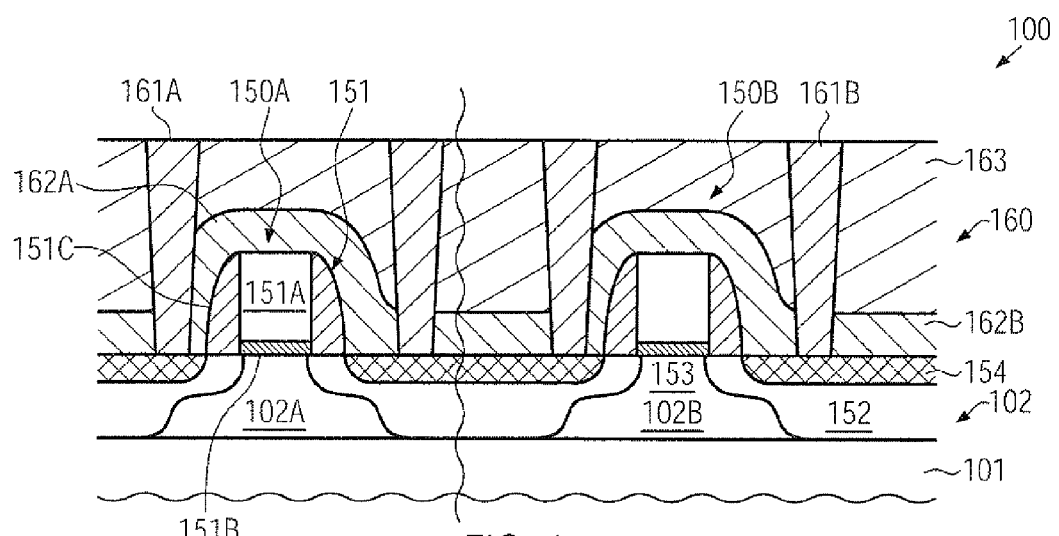

With reference to FIGS. 2a-2h, further illustrative embodiments will now be described in more detail, wherein reference may also be made to FIGS. 1a-1b, if appropriate.

Figure 2A:
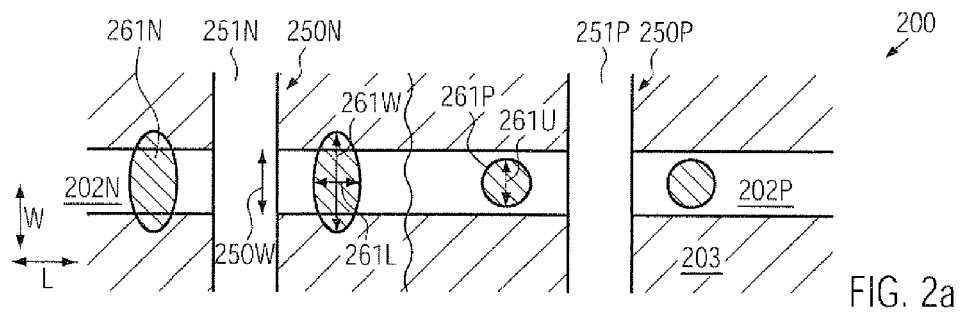
FIGS. 2a-2f schematically illustrate top views of semiconductor devices in which the contact level may have an appropriate configuration so as to increase the influence of contact elements for one type of transistor while reducing the effect thereof for the other type of transistor, according to illustrative embodiments.

FIG. 2a schematically illustrates a top view of a semiconductor device 200 comprising a plurality of transistor elements, wherein, for convenience, a first transistor 250N, which may represent an N-channel transistor, and a second transistor 250P, which may represent a P-channel transistor, are illustrated in FIG. 2a. The transistors 250N, 250P may have any appropriate configuration, as is also previously explained with reference to the semiconductor device 100, or as will be described later on in more detail. For example, the transistors 250N, 250P may comprise corresponding active regions 202N, 202P having formed therein an appropriate dopant profile as required for the transistor characteristic of the devices 250N, 250P. It should be appreciated that a plurality of transistor elements may be formed in and above the active region 202N, as is required in accordance with the overall device configuration. Similarly, the active region 202P may comprise one or more transistor elements, as required. Furthermore, as illustrated, a width direction W and a length direction L may be defined, wherein the length direction may substantially correspond to a general current flow direction during operation of the transistors 250N, 250P, while the width may represent a direction perpendicular to the general current flow direction. Consequently, a width of the transistors 250N, 250P may be defined by a width 250W taken along the width direction W. As previously explained, in sophisticated applications, the transistor width 250W may be in the range of approximately 100 nm and less in densely packed device regions. Moreover, the transistors 250N, 250P may comprise respective gate electrode structures 251N, 251P with any appropriate structure and critical dimensions in accordance with device requirements. The gate electrode structures 251N, 251P may be embedded in the material of a contact level, wherein these materials are not shown in FIG. 2a in order to not unduly complicate the schematic illustration of the contact level.

Furthermore, as illustrated, first contact elements 261N may be provided in the transistor 250N, wherein it is assumed that the contact elements 261N may be formed on the basis of a material composition that provides an internal stress that may be advantageous for enhancing performance of the transistor 250N, while negatively affecting performance of the transistor 250P. For example, in one illustrative embodiment, the contact elements 261N may be comprised of tungsten in combination with any appropriate barrier material, which may have an internal tensile stress level. On the other hand, second contact elements 261P may be provided in the transistor 250P and may be configured in view of lateral size and/or spatial relationship with respect to the gate electrode structure 251P such that a strain component induced by the elements 261P may be less compared to the strain component induced by the elements 261N. In the embodiment shown in FIG. 2a, the lateral size of the contact elements 261N may be significantly greater compared to the lateral size of the elements 261P, for instance by selecting one or both of lateral extensions 261W, 261L to be greater for the contact elements 261N compared to the contact elements 261P. As previously explained, the lateral size of the contact elements 261N, 261P is to be understood as the area defined by the lateral extensions 261W, 261L taken at any given height level, i.e., taken at any cross-section taken along a direction perpendicular to the drawing plane of FIG. 2a. For example, the lateral extension along the length direction, indicated as 261L, may be substantially the same for the elements 261N, 261P, while the lateral extension 261W may be greater for the contact elements 261N, for instance, in the embodiment shown, the lateral extension 261W of the elements 261N may be at least equal to or greater than the transistor width 250W. On the other hand, the lateral extension of the elements 261P along the width direction, indicated as 261U, may be significantly less and may, in some illustrative embodiments, be substantially equal to the lateral extension along the length direction L, thereby providing a design aspect ratio of 1, i.e., the length and width is substantially the same. Consequently, during a corresponding patterning process for forming openings of the contact elements 261N, 261P, the critical dimensions may be selected so as to comply with the requirements for the contact elements 261P, while additionally increasing the width of the contact elements 261N without unduly affecting the overall manufacturing sequence for patterning the contact openings and filling the same with the contact metal.

Figure 2B:
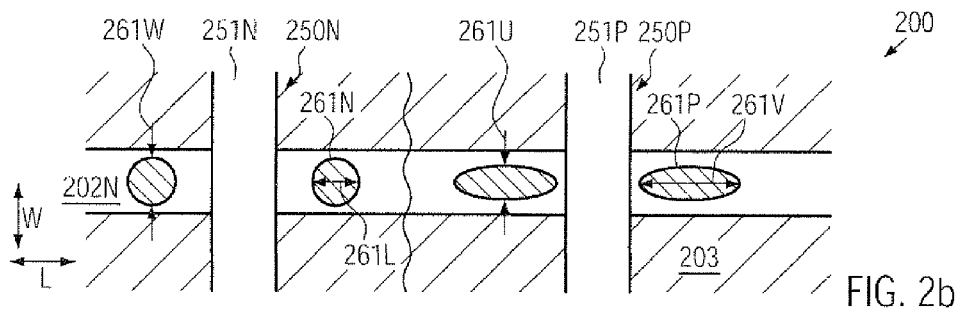

FIG. 2b schematically illustrates the semiconductor device 200 according to further illustrative embodiments in which the lateral size and thus the lateral extensions 261W, 261L may be selected such that a desired positive strain-inducing effect may be obtained by the contact elements 261N, while a negative effect caused by the contact elements 261P may be reduced by selecting a reduced lateral extension 261U so as to reduce the overall strain component acting along the transistor length direction. On the other hand, if desired, the length 261V of the contact elements 261P may be selected greater compared to the length 261L so that, in total, the overall conductivity of the contact elements 261P may be comparable or even greater compared to the contact elements 261N.

It should be appreciated that, in the embodiments described with reference to FIGS. 2a and 2b, an offset of the contact elements from the associated gate electrode structures may be the same for the transistors 250P, 250N so that the desired adaptation of the strain conditions may be accomplished by varying the lateral sizes of the contact elements 261P, 261N only. In other cases, as will also be described later on in more detail, in addition to varying the lateral sizes, the lateral offset may also be varied, for instance may be reduced in the transistor 250N and/or may be increased in the transistor 250P, if desired.

Figure 2C:
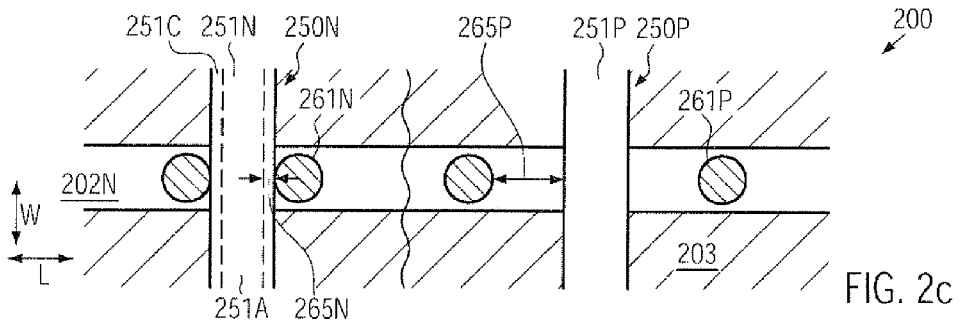

FIG. 2c schematically illustrates the semiconductor device 200 according to further illustrative embodiments in which, in addition to or alternatively to varying the lateral size of the contact elements 261N, 261P, an offset is appropriately selected. In the embodiment shown, an offset 265P, which is to be understood as a lateral offset in the sense that this offset is taken along the transistor length direction L, is significantly greater compared to a lateral offset 265N. As shown, the offset values 265P, 265N may be defined with respect to an electrode material 251A of the gate electrode structures 251N, 251P, wherein a spacer structure 251C may also be included in the gate electrode structures, as previously described with reference to the device 100 or as will be described later on in more detail. Furthermore, the offset values 265P, 265N may be defined by an edge of the elements 261P, 261N that is positioned closest to the electrode material 251A. It should be appreciated that increasing the lateral offset 265P compared to the offset 265N may not substantially negatively influence the overall series resistance of the transistor 250P, since typically the resistance thereof may be substantially determined by the channel resistivity, which may be significantly greater compared to the N-channel transistor 250N so that a small increase of the resistance caused by the offset 265P may not unduly contribute to the overall series resistance. On the other hand, the strain component induced by the contact elements 261P may be significantly reduced by increasing the offset 265P, which may overcompensate for the increase in series resistance between the contact elements 261P and the channel region underlying the electrode material 251A.

Figure 2D:
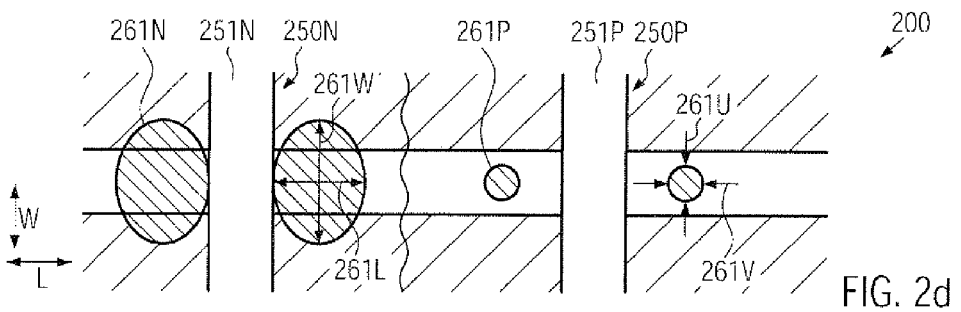

FIG. 2d schematically illustrates the semiconductor device 200 in which the contact elements 261N, 261P may have a different lateral size by selecting different critical dimensions in both the length direction L and the width direction W. As illustrated, both lateral extensions 261U and 261V of the contact elements 261P may be less compared to the corresponding lateral extensions 261W, 261L of the contact elements 261N.

Figure 2E:
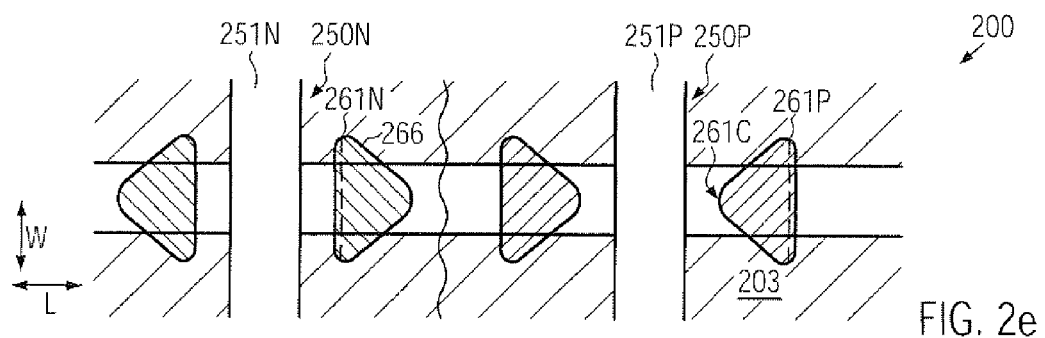

FIG. 2e schematically illustrates the semiconductor device 200 in which the spatial relationship of the contact elements 261N, 261P, respectively, with respect to the gate electrode structures may be selected differently, in addition to other geometric related factors such as lateral offset, lateral extension as described above, by appropriately orienting a spatial shape of the elements 261P, 261N. In the embodiment shown, the elements 261P, 261N may have substantially the same lateral size, thereby providing very similar electric characteristics of the contact elements in the transistors 250P, 250N and also providing very similar conditions during the manufacturing sequence for forming the contact elements. On the other hand, the orientation of the contact elements 261N, which may be considered as a generally triangular shaped configuration, may be selected such that a line 266 representing the maximum lateral extension along the transistor width direction W is positioned closer to the gate electrode structure 251N in the transistor 250N compared to the line 266 representing the maximum lateral extension of the contact element 261P. Thus, the line 266 represents an edge or at least a portion in the vicinity of the edge of the element 261N that is closest to the gate electrode 251N in the transistor 250N, thereby generating a maximum strain component. On the other hand, the line 266 of the element 261P is positioned so as to have the greatest possible offset from the gate electrode structure 251P, thereby minimizing the influence of the corresponding strain component. In this sense, the orientation of the contact elements 261N and the elements 261P may be considered inversely to each other, for instance rotated by 180 degrees with respect to an axis that is perpendicular to the drawing plane of FIG. 2e. It should be appreciated that the approximate triangular shape of the elements 261N, 261P may actually have rounded corner portions 261C due to constraints of the corresponding lithography and patterning processes. It should further be appreciated that the triangular contact elements 261P may be provided with a reduced lateral size and/or with an increased lateral offset compared to the elements 261N in order to further modulate the corresponding strain components. In other illustrative embodiments one or both of the contact elements 261N, 261P may have a substantially rectangular shape in which a short side of the rectangle may correspond to the width of the contact elements 261P and may have a value less than the width 250W (FIG. 2a), whereas the short side of the rectangle may represent the length of the contact elements 261N so that a long side of the rectangle may extend along the width direction W, thereby providing an enhanced strain component. Thus, also in this case, a basically identical shape may be applied for both the elements 261N, 261P, whereas an orientation thereof may be appropriately selected so as to obtain the desired strain effect in the transistors 250N, 250P. Also in this case, the lateral size may be substantially the same or different, depending on the overall requirements.

Figure 2F:
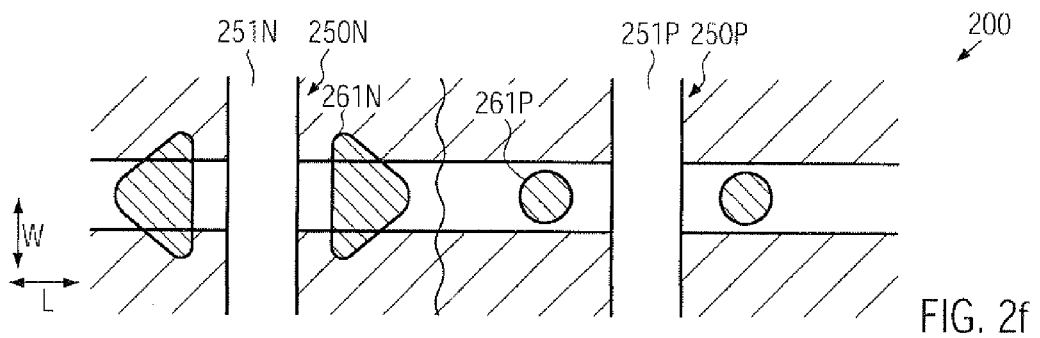

FIG. 2f schematically illustrates the semiconductor device 200 in which a plurality of geometrical factors may be different for the contact elements 261P and 261N. For instance, as illustrated, the contact elements 261N may have an increased lateral size and may also differ in their basic geometric shape while also a lateral offset from the gate electrode structure 251N may be less compared to the contact elements 261P. In the embodiment shown, the contact elements 261P may have a design aspect ratio of 1 and may have appropriate critical dimensions in both directions W and L in accordance with design requirements. Furthermore, the lateral offset may be selected so as to minimize a negative influence of the corresponding strain component, as previously explained. It should be appreciated, however, that other basic geometric shapes may be selected for the contact elements 261P, 261N in combination with appropriate lateral extensions in order to further enhance the overall strain adaptation. It should be appreciated that each of the above-described embodiments may be combined with each other of the above-described embodiments in order to efficiently adjust the overall strain conditions in the transistors 250N, 250P.

Figure 2G:
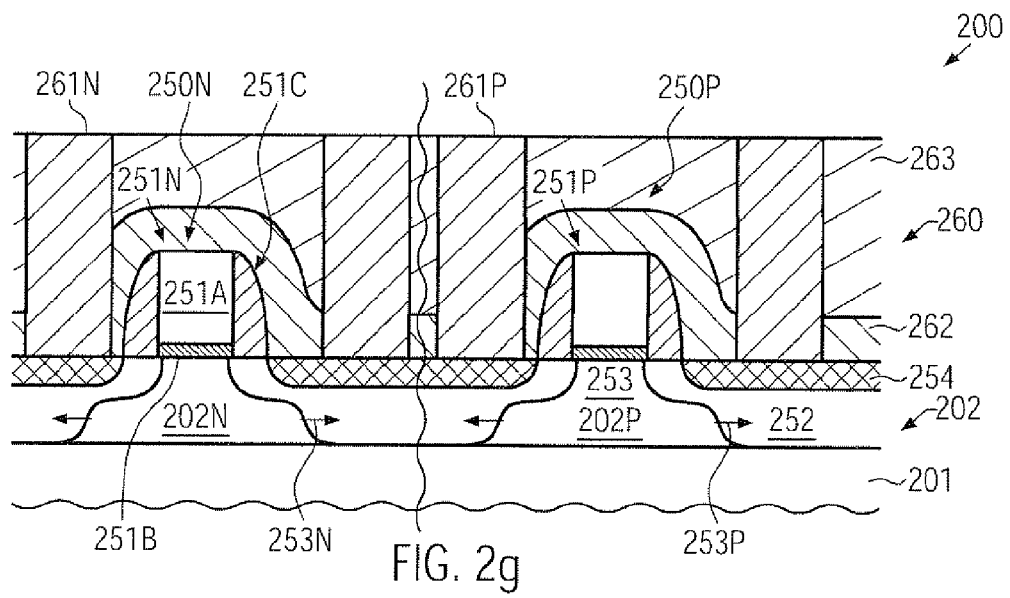
FIG. 2g schematically illustrates a cross-sectional view of the semiconductor device according to FIG. 2b as one example of a contact level with a superior design without requiring significant modifications in the device level, according to illustrative embodiments.

FIG. 2g schematically illustrates a cross-sectional view of the device 200 as illustrated in FIG. 2b in order to provide one example of a modified contact level in combination with a device level. As illustrated, the semiconductor device 200 may comprise a substrate 201, above which may be formed a semiconductor layer 202. For example, the substrate 201 may comprise any appropriate carrier material for providing thereabove the semiconductor layer 202, which may represent a silicon-based layer, a silicon/germanium layer, a germanium layer and the like. Generally, the semiconductor material in the layer 202 may respond to any strain component by a modification of the charge carrier mobility, as previously explained. For example, for a standard crystallographic configuration, a tensile strain component in the current flow direction, i.e., the length direction, may result in increased electron mobility, while the hole mobility may be reduced. The layer 202 may comprise the active regions 202P, 202N which may include drain and source regions 252 with appropriately formed metal silicide regions 254, which may also act as contact regions for the contact elements 261P, 261N, as is also previously described with reference to the device 100. Moreover, the gate electrode structures 251N, 251P may comprise the electrode material 251A in combination with a gate dielectric material 251B, thereby separating the electrode material 251A from a channel region 253. Moreover, a spacer structure 251C may be provided in the gate electrode structures 251N, 251P. With respect to any characteristics of materials and dimensions of the gate electrode structures 251N, 251P, the same criteria may apply as previously explained with reference to the semiconductor device 100. Moreover, a contact level 260 may be provided so as to comprise the contact elements 261N, 261P in combination with any materials, such as dielectric materials 262 and 263, as required. In some illustrative embodiments, the dielectric material 262 may be provided in the form of a strain-inducing material, at least for one of the transistors 250N, 250P, as is also previously explained with reference to the layers 162A, 162B of the device 100. In other cases, as previously explained, performance of both transistors 250N, 250P may be enhanced by providing at least a portion of the layer 262 with a corresponding internal stress level. In other cases, the material 262 above one or both of the transistors 250N, 250P may be provided in a substantially relaxed state, wherein a desired strain component may be obtained on the basis of the contact elements, such as the elements 261N or 261P. For example, if the materials of the contact level 260 may be provided in a substantially relaxed state above the transistor 250N, an efficient strain-inducing mechanism may be obtained on the basis of the elements 261N, while a corresponding negative effect of the elements 261P may be further reduced by providing the material 262 locally with a desired stress level, such as a compressive stress. Furthermore, the contact level 260 may comprise a further dielectric material 263, such as a silicon dioxide material and the like. It should be appreciated that the contact level 260 may be formed according to any appropriate configuration with respect to the materials used therein, wherein the efficient strain adaptation may be accomplished by appropriately configuring the contact elements 261N, 261P, as described above, without requiring a modification of the basic composition of the contact level 260. Consequently, the transistors 250N, 250P may be formed on the basis of any appropriate process strategy, for instance as previously described with reference to the device 100, without requiring a corresponding modification, while also the contact level 260 may be formed on the basis of well-established materials. Thereafter, the level 260 may be patterned on the basis of appropriate lithography masks and strategies, thereby taking into account the strain adapted configuration of the contact elements 261N, 261P, as described above. Thereafter, appropriate contact materials may be filled into the patterned contact level 260 on the basis of well-established process techniques, as described above. Thereafter, any excess material may be removed by polishing techniques and the like, thereby obtaining the configuration as shown in FIG. 2g. Hence, the contact elements 261P may have an increased lateral extension along the length direction, while a corresponding extension along the transistor width direction (the direction perpendicular to the drawing plane of FIG. 2g) may be less compared to the contact elements 261N, so that a strain component 253N in the form of a tensile strain component in the transistor 250N may be greater compared to the strain component 253P induced in the transistor 250P.

Figure 2H:
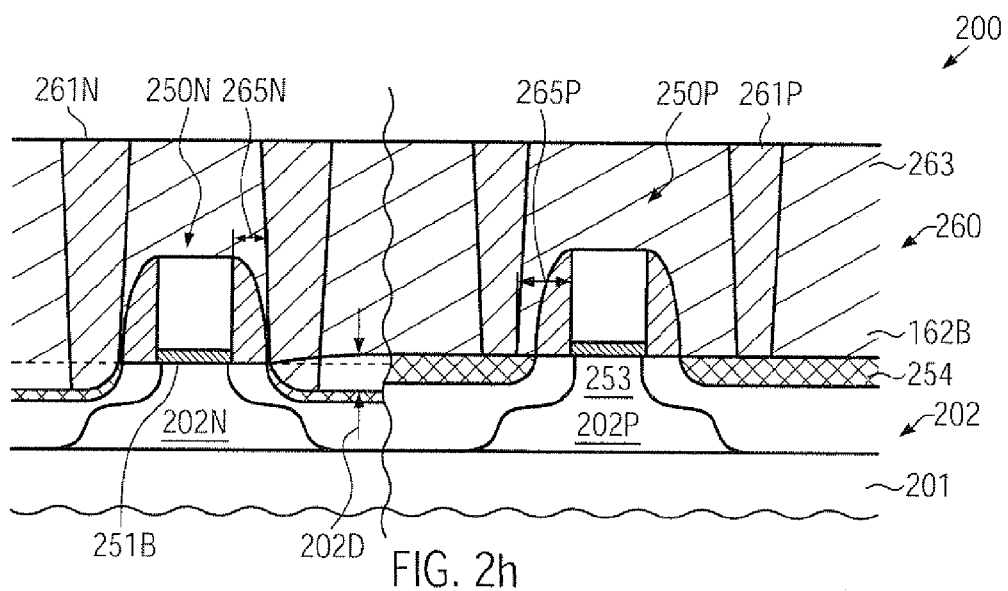
FIG. 2h schematically illustrates a cross-sectional view of a semiconductor device in which a lateral configuration or design of the contact level may be combined with a modification in the depth direction in order to further enhance the influence of contact elements for one type of transistor, according to further illustrative embodiments.

FIG. 2h schematically illustrates the semiconductor device 200 according to further illustrative embodiments in which, in addition to appropriately configuring the contact level 260 with respect to the overall strain in the transistors 250N, 250P, a modification in the device level may be applied. In the embodiment shown, a different lateral offset 265P compared to a lateral offset 265N may be used in the contact level 260 in order to reduce a non-desired strain component in the transistor 250P while increasing the effect thereof in the transistor 250N. It should be appreciated, however, that any other appropriate configuration may be selected, as described above, in order to obtain enhanced strain conditions in the transistors 250N, 250P. Moreover, a recessed drain and source configuration may be applied in the transistor 250N, for instance by recessing the drain and source regions, or at least a portion thereof, with respect to the gate dielectric material 251B, as indicated by 202D. Consequently, upon forming the contact level 260, a dielectric material thereof, which may include an internal stress level, may be positioned more closely to the channel region 253 of the transistor 250N and also material of the contact element 261N may be positioned within the recess 202D, thereby providing a more efficient strain transfer. Consequently, performance of the transistor 250N may be even further enhanced. The recessed configuration of the transistor 250N may be achieved by performing an etch process prior to forming the metal silicide regions, wherein the transistor 250P may be masked and thereafter the processing may be continued by removing the etch mask and forming the metal silicide regions.

It should be appreciated that, in other illustrative embodiments, a raised drain and source configuration may be applied in the transistor 250P in order to further reduce the influence of the contact elements 261P, wherein this mechanism may be applied in addition to or alternatively to the recessed configuration of the transistor 250N. For example, an appropriate semiconductor material may be selectively grown in exposed portions of the active region 202P in order to obtain a raised drain and source configuration.

As a result, the present disclosure provides semiconductor devices in which at least the contact level may be appropriately configured so as to enhance the influence of a stressed contact element in one type of transistor while reducing the influence of contact elements in the other type of transistor. For this purpose, the design or geometry of the contact level may be appropriately adapted so that the basic transistor configuration may not be substantially affected by the modified contact level, in particular for densely packed device regions with transistors having a moderately reduced transistor width of approximately 100 nm and less, and the internal stress level of the contact elements may be advantageously taken into consideration to enhance overall performance of the integrated circuit. Thus, for highly scaled transistor elements with gate lengths of 40 nm and less, which may have a single contact element at the drain side and the source side thereof, an efficient performance enhancing mechanism may be obtained on the basis of an appropriate configuration of the contact elements in N-channel transistors in order to enhance the overall tensile strain component, while a negative influence in the P-channel transistors may be significantly reduced. In some illustrative embodiments, the strain modified or strain optimized configuration in the contact level may be combined with additional mechanisms in the device level, such as a recessed drain and source configuration and the like.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modifeed and all such variations are considered within the scope and spirit of the invention. Accordingly, the protection sought herein is as set forth in the claims below.

What is claimed:

1. A semiconductor device, comprising:
a first transistor formed above a substrate and comprising a first gate electrode structure extending along a first transistor width direction of said first transistor;
a second transistor formed above said substrate and comprising a second gate electrode structure extending along a second transistor width direction of said second transistor;
a first contact element connecting to one of a drain region and a source region of said first transistor, said first contact element comprising a conductive contact material having a predefined type of internal stress so as to induce a first strain component of a first type in a channel region of said first transistor; and
a second contact element connecting to one of a drain region and a source region of said second transistor, said second contact element comprising a conductive contact material having said predefined type of internal stress, said first and second contact elements differing in at least one of a lateral size and a lateral spatial relationship with respect to a respective one of said first and second gate electrode structures so as to induce a second strain component of said first type in a channel region of said second transistor that is less than said first strain component, and wherein at least one of said first and second contact elements has a substantially triangular shaped cross-sectional configuration.

2. The semiconductor device of claim 1, wherein said conductive contact material of said first and second contact elements is a metal.

3. The semiconductor device of claim 2, wherein said contact metal has an internal tensile stress.

4. The semiconductor device of claim 1, wherein said first contact element has a first width along said first transistor width direction that is greater than a second width of said second contact element along said second transistor width direction.

5. The semiconductor device of claim 1, wherein a first lateral offset of said first contact element from said first gate electrode structure is less than a second lateral offset of said second contact element from said second gate electrode structure.

6. The semiconductor of device claim 1, wherein a first edge of said first contact element that faces said first gate electrode structure and extends along said first transistor width direction is longer than a second edge of said second contact element that faces said second gate electrode structure and extends along said second transistor width direction.

7. The semiconductor of device claim 1, wherein said first contact element has a first substantially triangular shaped cross-sectional configuration and said second contact element has a second substantially triangular shaped cross-sectional configuration.

8. The semiconductor device of claim 1, wherein said first contact element extends along at least the entire width of said first transistor.

9. The semiconductor device of claim 1, wherein said first and second contact elements differ in lateral size and have substantially a same lateral spatial relationship with respect to said respective one of said first and second gate electrode structures.

10. The semiconductor device of claim 1, wherein said first and second contact elements differ in lateral spatial relationship with respect to a respective one of said first and second gate electrode structures and wherein a lateral size of said first and second contact elements is substantially the same.

11. The semiconductor device of claim 1, wherein said first and second contact elements differ in lateral size and lateral relationship with respect to a respective one of said first and second gate electrode structures.

12. The semiconductor device of claim 3, wherein said first transistor is an N-channel transistor and said second transistor is a P-channel transistor.

13. The semiconductor device of claim 1, wherein no contact elements other than said first contact element connect to said one of said drain region and said source region of said first transistor.

14. The semiconductor device of claim 1, further comprising a first strain-inducing layer formed above said first transistor and a second strain-inducing layer formed above said second transistor, wherein said first strain-inducing layer induces a strain in the channel region of said first transistor that is of a same type as said first type and said second strain-inducing layer induces a strain in the channel region of said second transistor that is of an opposite type to said first type.

15. The semiconductor device of claim 1, wherein said first and second contact elements additionally differ in a spatial relationship with respect to a depth direction of said drain and source regions of the first and second transistors.

16. The semiconductor device of claim 1, wherein said substantially triangular shaped cross-sectional configuration comprises rounded corner portions.

17. The semiconductor device of claim 7, wherein said first substantially triangular shaped cross-sectional configuration has a first side with a first maximum lateral extension length along said first transistor width direction and said second substantially triangular shaped cross-sectional configuration has a second side with a second maximum lateral extension length along said second transistor width direction.

18. The semiconductor device of claim 17, wherein said first side faces substantially toward said first gate electrode structure and said second side faces substantially away from said second gate electrode structure.

19. A semiconductor device, comprising:
an N-channel transistor comprising a first contact region;
a P-channel transistor comprising a second contact region;
a first tensile-strained contact element connecting to said first contact region and having a first lateral extension along a width direction of said N-channel transistor, said first tensile-strained contact element having a substantially triangular shaped cross-sectional configuration; and
a second tensile-strained contact element connecting to said second contact region and having a second lateral extension along a width direction of said P-channel transistor, said second lateral extension being less than said first lateral extension.

20. The semiconductor device of claim 19, wherein no contact element other than said first tensile-strained contact element connects to said first contact region.

21. The semiconductor device of claim 19, wherein a lateral size of said first tensile-strained contact element is greater than a lateral size of said second tensile-strained contact element.

22. The semiconductor device of claim 19, wherein a first lateral offset of said first tensile-strained contact element from a gate electrode of said N-channel transistor is less than a second lateral offset of said second tensile-strained contact element from a gate electrode of said P-channel transistor.

23. A semiconductor device, comprising:
- an N-channel transistor comprising a first gate electrode and a first contact region;
- a P-channel transistor comprising a second gate electrode and a second contact region;
- a first tensile-strained contact element connecting to said first contact region and having a first lateral extension representing a maximum lateral extension along a width direction of said N-channel transistor; and
- a second tensile-strained contact element connecting to said second contact region and having a second lateral extension representing a maximum lateral extension along a width direction of said P-channel transistor, a first offset of said first lateral extension from said first gate electrode being less than a second offset of said second lateral extension from said second gate electrode, wherein at least one of said first and second tensile-strained contact elements has a substantially triangular shaped cross-sectional configuration.

24. The semiconductor device of claim 23, wherein said first and second lateral extensions are substantially the same.

25. The semiconductor device of claim 23, wherein a lateral size of said first tensile-strained contact element is greater than a lateral size of said second tensile-strained contact element.

26. The semiconductor device of claim 23, wherein a lateral size of said first tensile-strained contact element is approximately the same as a lateral size of said second tensile-strained contact element.

* * * * *